US010103718B1

(12) United States Patent
Swanson et al.

(10) Patent No.: US 10,103,718 B1
(45) Date of Patent: Oct. 16, 2018

(54) RECALIBRATION OF SOURCE SYNCHRONOUS SYSTEMS

(71) Applicant: Xilinx, Inc., San Jose, CA (US)

(72) Inventors: Richard W. Swanson, San Jose, CA (US); Terence J. Magee, San Francisco, CA (US); Qi Zhang, Chandler, AZ (US); Srinivas Vura, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/480,283

(22) Filed: Apr. 5, 2017

(51) Int. Cl.

| | |
|---|---|
| ***G11C 11/407*** | (2006.01) |
| ***G11C 7/22*** | (2006.01) |
| ***H03K 5/134*** | (2014.01) |
| ***G11C 7/00*** | (2006.01) |
| ***G11C 7/10*** | (2006.01) |
| ***H03K 5/06*** | (2006.01) |
| ***G11C 11/4076*** | (2006.01) |
| ***H04L 7/00*** | (2006.01) |
| *H03K 5/00* | (2006.01) |

(52) U.S. Cl.
CPC ............ *H03K 5/06* (2013.01); *G11C 11/4076* (2013.01); *H04L 7/0033* (2013.01); *H03K 2005/00019* (2013.01)

(58) Field of Classification Search
CPC ........... H03K 5/06; H03K 2005/00019; G11C 11/4076; G11C 7/22; H04L 7/0033; H03L 7/00; H03H 11/26
USPC .................................................. 327/261–333
See application file for complete search history.

(56) References Cited

U.S. PATENT DOCUMENTS

2005/0156646 A1* 7/2005 Liou .................... G11C 7/1006 327/276
2009/0067268 A1* 3/2009 Seo ...................... G11C 7/1051 365/193
2010/0271092 A1* 10/2010 Zerbe ................. G06F 13/4243 327/161
2013/0294176 A1* 11/2013 Nishio ..................... G11C 8/18 365/189.05
2014/0173325 A1* 6/2014 Ryu .................... G06F 13/1689 713/601
2015/0146477 A1* 5/2015 Iijima ................ G11C 11/4076 365/154
2016/0351245 A1* 12/2016 Kano ................. G11C 11/4076

* cited by examiner

*Primary Examiner* — Brandon S Cole
(74) *Attorney, Agent, or Firm* — Robert M. Brush

(57) ABSTRACT

An example method of calibrating a source-synchronous system includes: performing initial calibration of a source-synchronous receiver, which is configured to receive data signals and a strobe, to determine an initial strobe delay and initial data delays; setting a strobe delay circuit that delays the strobe to have the initial strobe delay and data delay circuits that delay the data signals to have the initial data delays; measuring first data eye margins of the data signals at a first time; calculating metrics for the data signals based on the first data eye margins; and measuring second data eye margins of the data signals at a second time; and updating the data delay circuits and the strobe delay circuit based on the second data eye margins and the metrics.

20 Claims, 7 Drawing Sheets

RECALIBRATION OF SOURCE SYNCHRONOUS SYSTEMS

TECHNICAL FIELD

Examples of the present disclosure generally relate to electronic circuits and, in particular, to recalibration of source synchronous systems.

BACKGROUND

High-speed source synchronous systems require highly accurate alignment between data bits within a data eye and highly accurate placement of the sampling dock within the center of the composite data eye to maximize performance. The ideal alignment of the data bits and the ideal placement of the sampling clock are typically determined using complex training algorithms designed to induce the worst case data eye caused from non-ideal factors, such as intersymbol interference (ISO, supply noise, channel reflections, and the like. This training process often becomes highly involved and requires a significant amount of time to execute. Furthermore, the training algorithm can only determine the ideal placement for a given voltage and temperature point at the time of calibration. Over time, this ideal positioning will change due to voltage and temperature changes, which will induce both internal and external delay changes within the system. These changing delays will cause the system timing to drift away from its ideal location and will result in performance loss.

The most accurate process for compensating for drift is to recalibrate the system using the complex training process. However, using the complex training process to recalibrate the system has the adverse effect of halting the data flow during recalibration, which reduces throughput of the system. It is desirable to minimize the amount of time required to recalibrate the system in order to minimize the impact the recalibration process has on the overall system. At the same time, the recalibration process should maintain the accuracy of the original timing intensive (complex) training algorithm as voltage and temperature change.

SUMMARY

In an example, method of calibrating a source-synchronous system includes: performing initial calibration of a source-synchronous receiver, which is configured to receive data signals and a strobe, to determine an initial strobe delay and initial data delays; setting a strobe delay circuit that delays the strobe to have the initial strobe delay and data delay circuits that delay the data signals to have the initial data delays; measuring first data eye margins of the data signals at a first time; calculating metrics for the data signals based on the first data eye margins; and measuring second data eye margins of the data signals at a second time; and updating the data delay circuits and the strobe delay circuit based on the second data eye margins and the metrics.

In another example, a source-synchronous receiver includes a first receiver configured to receive a strobe, the first receiver including a strobe delay circuit; second receivers configured to receive data signals referenced to the strobe, the second receivers including data delay circuits; and a calibration circuit configured to: perform initial calibration to determine an initial strobe delay for the strobe delay circuit and initial data delays for the data delay circuits; measure first data eye margins of the data signals at a first time; calculate metrics for the data signals based on the first data eye margins; measure second data eye margins of the data signals at a second time; and update the data delay circuits and the strobe delay circuit based on the second data eye margins and the metrics.

In another example, a system includes: a source-synchronous transmitter coupled to a source-synchronous receiver through a plurality of transmission lines, the source-synchronous receiver comprising a first receiver configured to receive a strobe, the first receiver including a strobe delay circuit, second receivers configured to receive data signals referenced to the strobe, the second receivers including data delay circuits, and a calibration circuit configured to: perform initial calibration to determine an initial strobe delay for the strobe delay circuit and initial data delays for the data delay circuits; measure first data eye margins of the data signals at a first time; calculate metrics for the data signals based on the first data eye margins; measure second data eye margins of the data signals at a second time; and update the data delay circuits and the strobe delay circuit based on the second data eye margins and the metrics.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
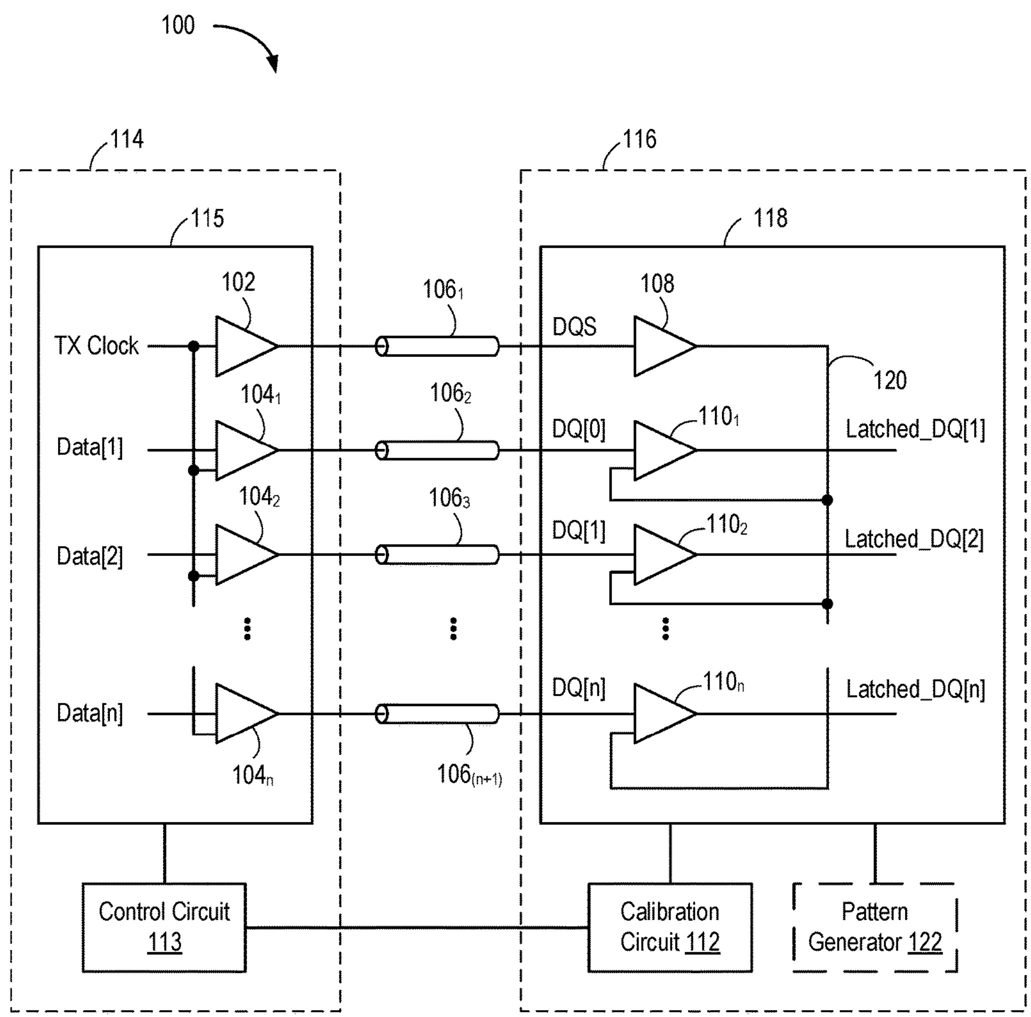
FIG. 1 is a block diagram depicting a source synchronous system according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for calibrating and recalibrating source synchronous systems are described. In a source synchronous system, transmitting device sends both a clock signal (referred to as a strobe), and data signals referenced to the clock signal, to a receiving device. Example source synchronous systems in which the techniques described herein can be used include point-to-point interconnects (e.g., Intel® QuickPath interconnect, HyperTransport®, etc.), memories, (e.g., source-synchronous dynamic random access memory (SDRAM), graphics dynamic random access memory (GDRAM), etc.), and the like.

In an example, a source synchronous receiver routes the strobe to each data capture flip-flop. The strobe has an intrinsic delay due to the clock tree and an additional programmable delay. The strobe programmable delay is used to center the strobe within the data eye. Each data input also has a programmable delay prior to the capture flip-flop. The data programmable delays are used to deskew any offset between data bits within a data byte. The data programmable delays also can be used to add delay to offset the clock tree delay.

An initial calibration routine is used to calibrate the source synchronous receive path. The initial calibration routine uses one or more complex training patterns (e.g., pseudorandom binary sequence (PRBS) patterns) to align the worst-case data eyes for each data signal to each other and then optimize the strobe location within the composite data eye to maximize margin. Using the initial calibration routine to recalibrate the source synchronous receive path would have adverse effects on the system, as described above. Using the initial calibration routine with a simple calibration pattern (relative to the initial calibration patterns) would not induce the worst-case data eye, causing both the data skew and the strobe alignment to appear to be sub-optimal.

Accordingly, in the techniques described herein, recalibration is performed by measuring the margins using a simple calibration pattern, such as a clock pattern or the like, and then calculate a ratio (referred to as the Kfactor) that describes the relative location of the strobe within the data eye. This relative location is then maintained using a less complex recalibration routine (as compared to the initial calibration routine). The recalibration routine preserves the relative location of both the strobe and the skew between data bits established by the initial calibration over voltage and temperature (VT) changes. These and further aspects are discussed below with respect to the drawings.

FIG. 1 is a block diagram depicting a source synchronous system 100 according to an example. The source synchronous system 100 includes a first circuit 114 coupled to a second circuit 116 through transmission lines 106. The circuit 114 includes a source-synchronous transmitter 115 and a control circuit 113. The circuit 116 includes a source-synchronous receiver 118 and a calibration circuit 112. The source-synchronous transmitter 115 includes a transmitter 102 and transmitters $104_1$ . . . $104_n$ (where n is a positive integer). The source-synchronous receiver 118 includes a receiver 108 and receivers $110_1$ . . . $110_n$. The control circuit 113 can be coupled to the calibration circuit 112.

In particular, the transmitter 102 receives a clock signal (TX Clock) having a clock pattern. The transmitters $104_1$ . . . $104_n$ receive n data signals (Data[1] . . . Data[n]) each having a data pattern. The transmitters $104_1$ . . . $104_n$ also receive TX clock. The transmitter 102 is coupled to the receiver 108 through a transmission line $106_1$. The input of the receiver 108 is referred to as DQS. The transmitters $104_1$ . . . $104_n$ are coupled to the receivers $110_1$ . . . $110_n$ via transmission lines $106_2$ . . . $106_{(n+1)}$, respectively. The inputs of the receivers $110_1$ . . . $110_n$ are referred to as DQ[1] . . . DQ[n], respectively. The calibration circuit 112 is coupled to the receiver 108 and the receivers $110_1$ . . . $110_n$. The receivers $110_1$ . . . $110_n$ output latched data signals (Latched_DQ[1] . . . Latched_DQ[n]).

In operation, the source-synchronous transmitter 115 transmits TX clock and Data[1] . . . Data[n] in parallel over transmission lines 106 to the source-synchronous receiver 118. The transmitters $104_1$ . . . $104_n$ transmit the data signals based on TX Clock. The receiver 108 receives a DQS signal (referred to as a "strobe signal" or "strobe") from the transmission line $106_1$. The receivers $110_1$ . . . $110_n$ receive DQ[1] . . . DQ[n] signals (referred to as "data signals" or "data bits") from the transmission lines $106_2$ . . . $106_{(n+1)}$. Thus, the source-synchronous receiver 118 includes the DQS and DQ[1] . . . DQ[n] signals as input and the Latched_DQ[1] . . . Latched_DQ[n] signals as output. The input signals (DQS and DQ) can be differential signals or single-ended signals, depending on the design of the transmitters 102 and the transmitters $104_1$ . . . $104_n$.

A clock buffer 120 distributes the DQS signal to the receivers $110_1$ . . . $110_n$. The calibration circuit 112 controls programmable delay circuits in the receiver 108 and the receivers $110_1$ . . . $110_n$ to deskew the DQ[1] . . . DQ[n] signals and to center the strobe in the composite data eye. The calibration circuit 112 also implements a two-stage calibration process including initial calibration and recalibration stages, as described further below. First, the calibration circuit 112 performs an initial calibration, which can be a robust calibration routine that uses one or more complex data patterns (e.g., one or more PRBS patterns) to induce worst-case data eye. Then, the calibration circuit 112 performs a recalibration, which is less complex calibration routine that uses a less complex data pattern (e.g., a clock pattern). The recalibration process preserves the relative location of both the strobe and the skew between the data bits established by the initial calibration.

Figure 2:
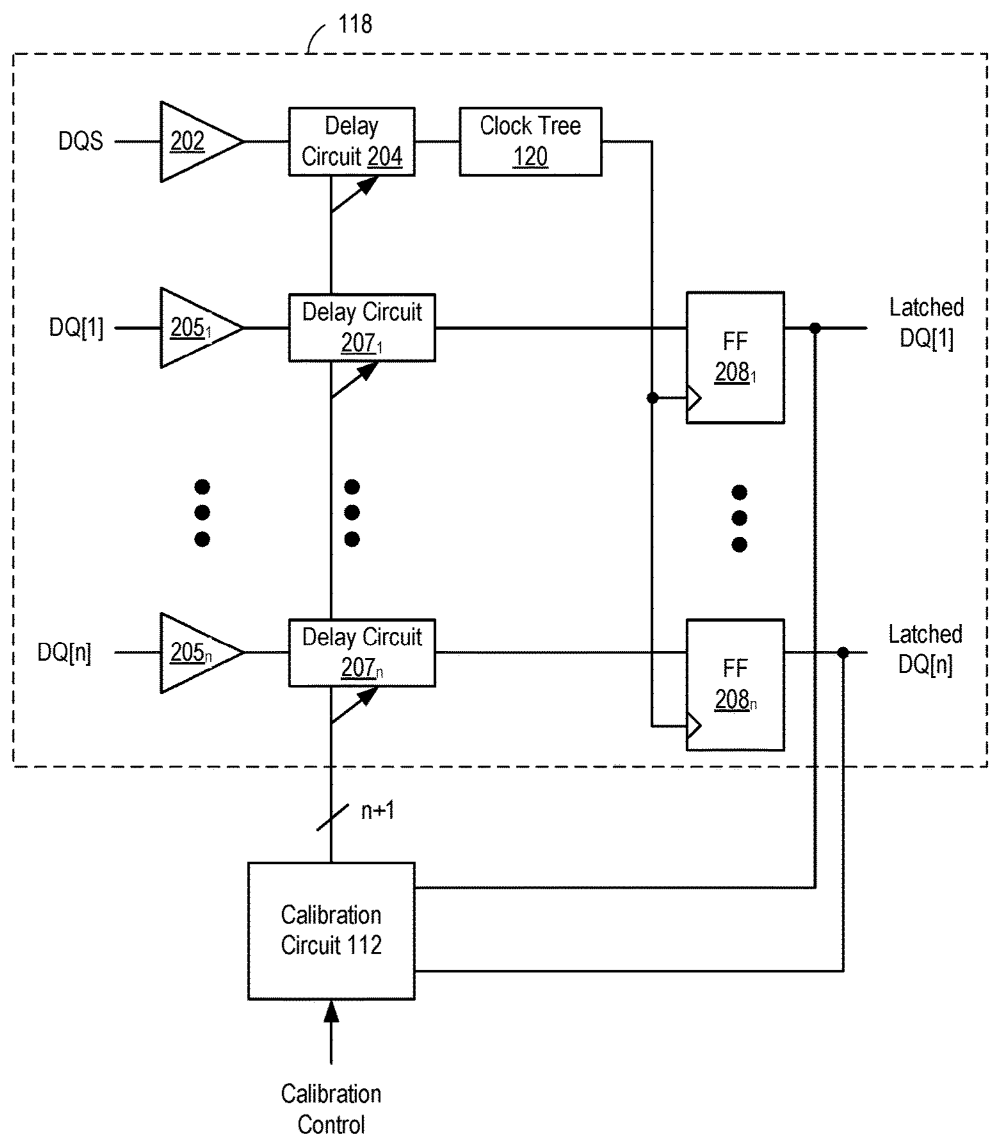
FIG. 2 is a block diagram depicting a source synchronous receive path according to an example.

FIG. 2 is a block diagram depicting the source-synchronous receiver 118 according to an example. The source-synchronous receiver 118 includes an input buffer 202, input buffers $205_1$ . . . $205_n$, a delay circuit 204, delay circuits $207_1$ . . . $207_n$, the clock buffer 120, and flip-flops (FF) $208_1$ . . . $208_n$. The input buffer 202 and the delay circuit 204 can be part of the receiver 108. The input buffers $205_1$ . . . $205_n$, the delay circuits $207_1$ . . . $207_n$, and the flip-flops $208_1$ . . . $208_n$ can be part of the receivers $110_1$ . . . $110_n$, respectively. The delay circuit 204 is also referred to as the DQS delay or DQS delay circuit. The delay circuits $207_1$ . . . $207_n$ are also referred to as the DQ delays or DQ delay circuits.

The input buffer 202 receives the DQS signal. The input buffers $205_1$ through $205_n$ receive the DQ[1] . . . DQ[n] signals. The delay circuit 204 applies a programmable delay to the DQS signal output from the input buffer 202. The clock buffer 120 distributes the DQS signal as delayed by the delay circuit 204 to the flip-flops $208_1$ . . . $208_n$. The delay circuits $207_1$ . . . $207_n$ each apply a programmable delay to a respective DQ signal. The flip-flops $208_1$ . . . $208_n$ sample the DQ signals as delayed by the delay circuits $207_1$ . . . $207_n$. The flip-flops $208_1$ . . . $208_n$ output the Latched_DQ[1] . . . Latched_DQ[n] signals.

The calibration circuit 112 outputs (n+1) control signals for controlling the delay circuit 204 and the delay circuits $207_1$ . . . $207_n$. The calibration circuit 112 can increment or decrement the delay circuit 204 and the delay circuits $207_1$ . . . $207_n$ to increase or decrease delay. The calibration circuit 112 also receives the Latched_DQ[1] . . . Latched_DQ[n] signals from the flip-flops $208_1$ . . . $208_n$. The calibration circuit 112 can also receive a calibration control signal that initiates the calibration process (e.g., from the control circuit 113). The calibration circuit 112 performs a calibration process, as described further below.

Figure 3:
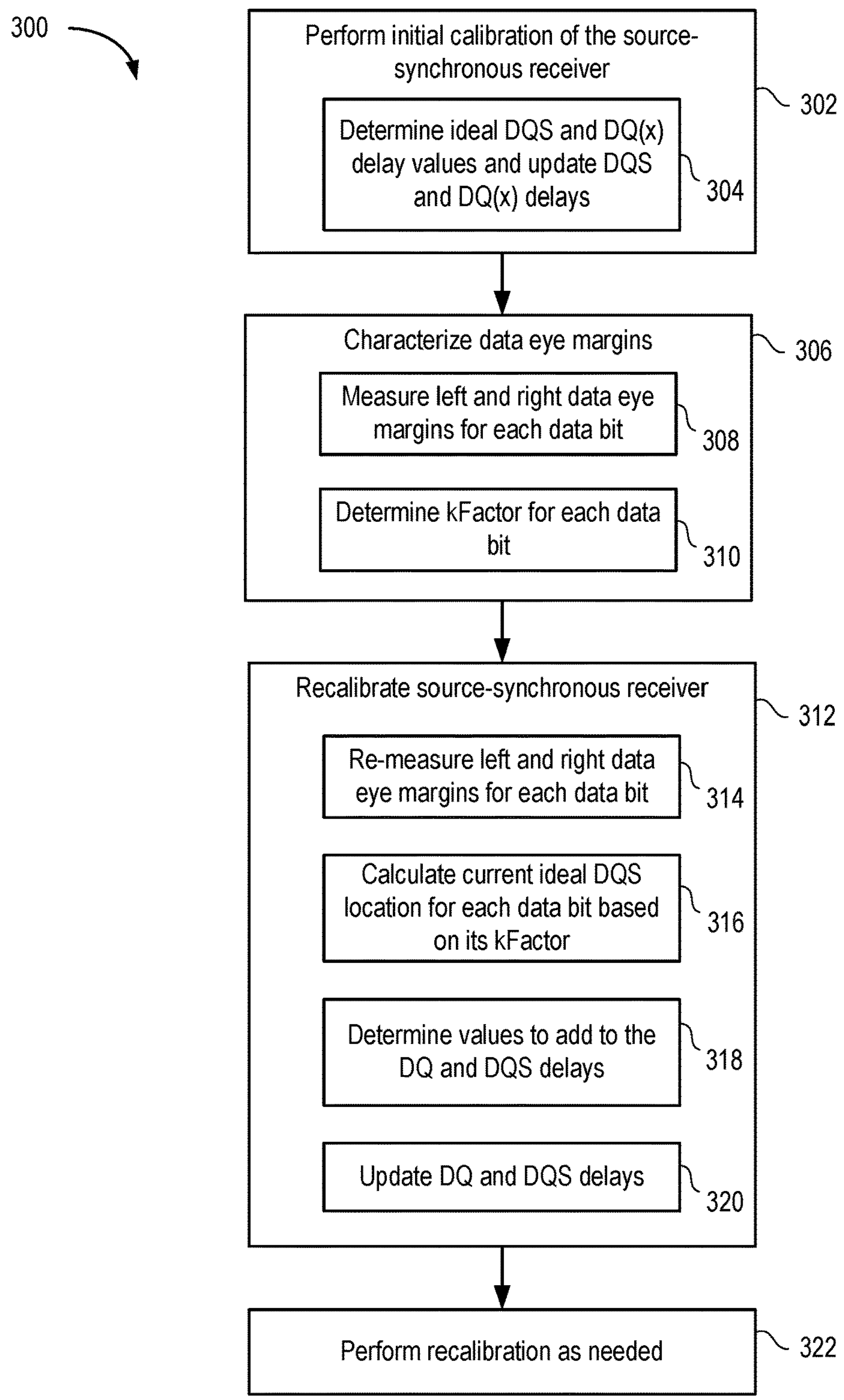
FIG. 3 is a flow diagram depicting a method of calibrating a source synchronous system according to an example.

FIG. 3 is a flow diagram depicting a method 300 of calibrating a source synchronous system 100 according to an example. The method 300 begins at step 302, where the source synchronous system 100 performs an initial calibration of the source-synchronous receiver 118. In an example, at step 304, the calibration circuit 112 can perform a training algorithm to determine ideal DQS and DQ(x) delay values (where x=1, 2, . . . , n) and to update the delay circuits 204 and $207_1$ . . . $207_n$. Any known training algorithm can be used.

At step 306, the calibration circuit 112 characterizes data eye margins for the DQ[1] . . . DQ[n] signals. For example, at step 308, the calibration circuit 112 measures the left and right data eye margins for each data bit. The calibration circuit 112 can measure the data eye margins while the source-synchronous receiver 118 is receiving a simple data pattern, such as a clock pattern or similar pattern. In an example, the source-synchronous transmitter 115 can transmit the data pattern. In another example, the circuit 116 can include a pattern generator 122 configured to couple a strobe and data pattern to the source-synchronous receiver 118.

In an example, the calibration circuit 112 measures the left margin (LM) for each data bit by determining the number of DQ steps (or taps) required to align the left edge of the data eye to the strobe location. That is, for the data signals DQ[1] . . . DQ[n], the calibration circuit 112 can increment the delay circuits $207_1$ . . . $207_n$ (DQ delays) until detecting the left edge of the data eye. Alternatively, the calibration circuit 112 can decrement the delay circuit 204 (DQS delay) until detecting the left edge of the data eye. In yet another alternatively, the calibration circuit 112 can perform a combination of incrementing the delay circuits $207_1$ . . . $207_n$ (DQ delays) and decrementing the delay circuit 204 (DQS delay) until detecting the left edge of the data eye.

The calibration circuit 112 measures the right margin (RM) for each data bit by determining the number of DQS steps (or taps) required to align the strobe to the right edge of the data eye. That is, for the data signals DQ[1] . . . DQ[n], the calibration circuit 112 can increment the delay circuit 204 (DQS delay) until detecting the right edge of the data eye. Alternatively, the calibration circuit 112 can decrement the delay circuits $207_1$ . . . $207_n$ (DQ delays) until detecting the right edge of the data eye. In yet another alternative, the calibration circuit 112 can perform a combination of incrementing the delay circuit 204 (DQS delay) and decrementing the delay circuits $207_1$ . . . $207_n$ (DQ delays) to detect the right edge of the data eye.

At step 310, the calibration circuit 112 determines a metric for each data bit that describes the relative location of the strobe within the data eye (referred to as the kFactor). The kFactor metric relates the right and left data eye margins. In an example, kFactor(x)=LM(x)/(LM(x)+RM(x)), x=1, 2, . . . , n. In the examples above, it is assumed that the DQ step size (step size of the delay circuits $207_1$ . . . $207_n$) is equal to the DQS step size (step size of the delay circuit 204). The procedure can also be performed if the relationship between the DQ step size and the DQS step size is known (e.g., DQ=Z*DQS, where Z is a positive number).

Figure 4:
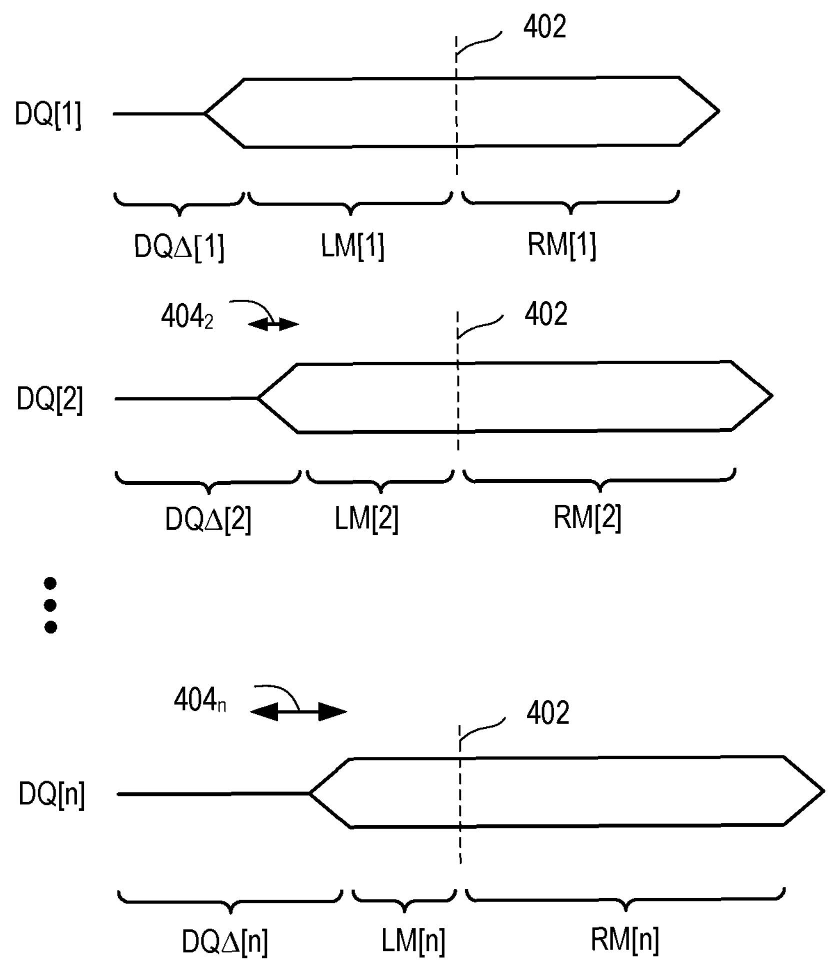
FIG. 4 illustrates the relationship between data eyes and data eye margins.

FIG. 4 illustrates the relationship between the data eyes of the data signals and the data eye margins determined in step 306. Dashed lines 402 indicate the strobe location, which is aligned after the initial calibration performed in step 302. The data signals DQ[1] . . . DQ[n] includes left margins LM[1] . . . LM[n] and right margins RM[1] . . . RM[n]. Further, the data signals DQ[1] . . . DQ[n] are delayed by delays DQΔ[1] . . . DQΔ[n]. After the initial calibration, the data signals DQ[2] . . . DQ[n] include skews $404_2$ . . . $404_n$ with respect to the data signal DQ[1].

Returning to FIG. 3, at step 312, the calibration circuit 112 recalibrates the source-synchronous receiver 118. The calibration circuit 112 can recalibrate the source-synchronous receiver 118 upon command, upon a detected change in VT, upon a detected change in any delay, or the like. In an example, at step 314, the calibration circuit 112 re-measures the left and right data eye margins for each data bit. The calibration circuit 112 can re-measure the left and right data eye margins for each data bit using the techniques described above in step 306. At step 316, the calibration circuit 112 calculates a current ideal DQS location for each data bit based on its kFactor. An example algorithm for calculating the current ideal DQS locations for the data bits is described below with respect to FIG. 5. At step 318, the calibration circuit 112 calculates values to add to the DQ delays and the DQS delay based on the current ideal DQS locations determined in step 316. Example algorithms for calculating the values to add to the DQ delays are described below with respect to FIG. 6. At step 320, the calibration circuit 112 updates the DQ delays (the delay circuits $207_1$ . . . $207_n$) and the DQS delay (the delay circuit 204) based on the values calculated in step 318.

At step 322, the calibration circuit 112 can perform recalibration as needed. That is, the calibration circuit 112 can repeat step 312 for as many times as needed based on command, VT changes, delay changes, etc.

Figure 5:
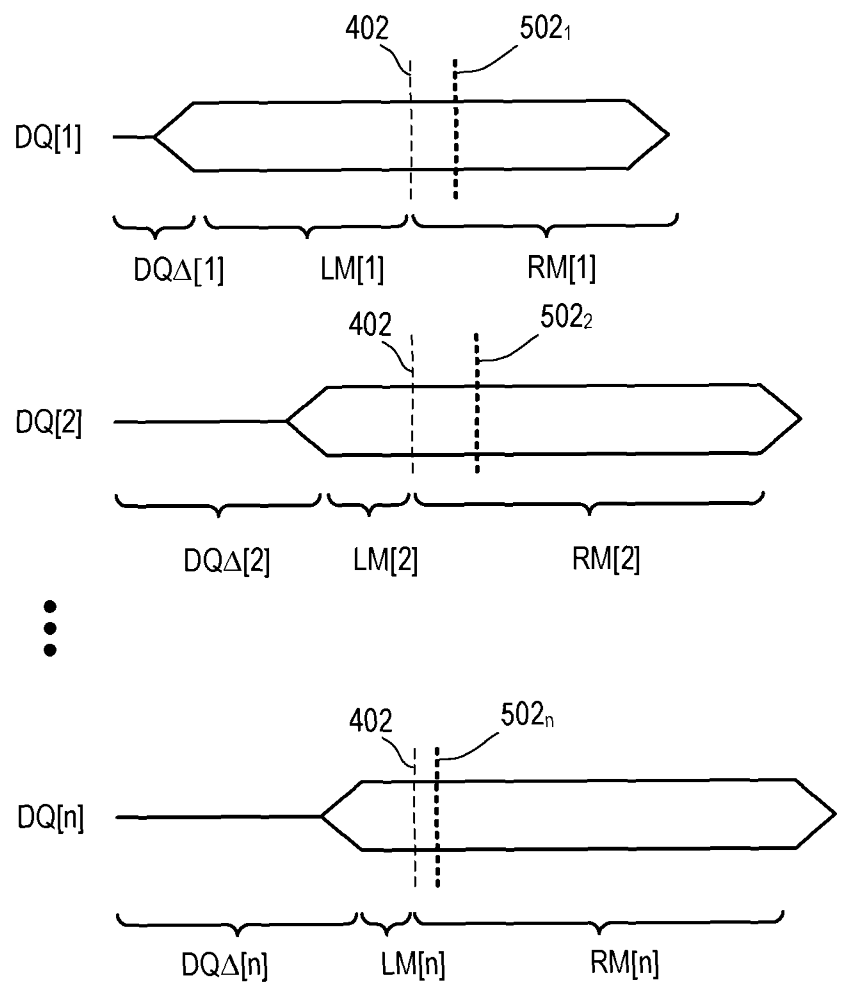
FIG. 5 illustrates the relationship between data eyes and ideal strobe locations.

FIG. 5 illustrates the relationship between the data eyes of the data signals and the current ideal DQS locations. After a time period, the data eye for each data signal can shift right or left and/or the strobe location can shift right or left. In FIG. 5, the dashed lines 402 indicate the current strobe location with the data eyes. The dashed lines $502_1$ through $502_n$ indicate the current ideal DQS locations for the data bits calculated based on the re-measured RM and LM values In an example, the ideal DQS location for the xth data signal is calculated as follows:

$$DQS[x]=(DQS_{taps}-LM[x])+(LM[x]+RM[x])*\text{kFactor}[x],$$

where $DQS_{taps}$ is the DQS delay value (e.g., the delay value of the delay circuit 204). Note that the re-measured left and right margin values (step 314) can differ from the initially measured left and right margin values measured at step 308 after the initial calibration (e.g., due to VT changes or other delay changes).

Figure 6:
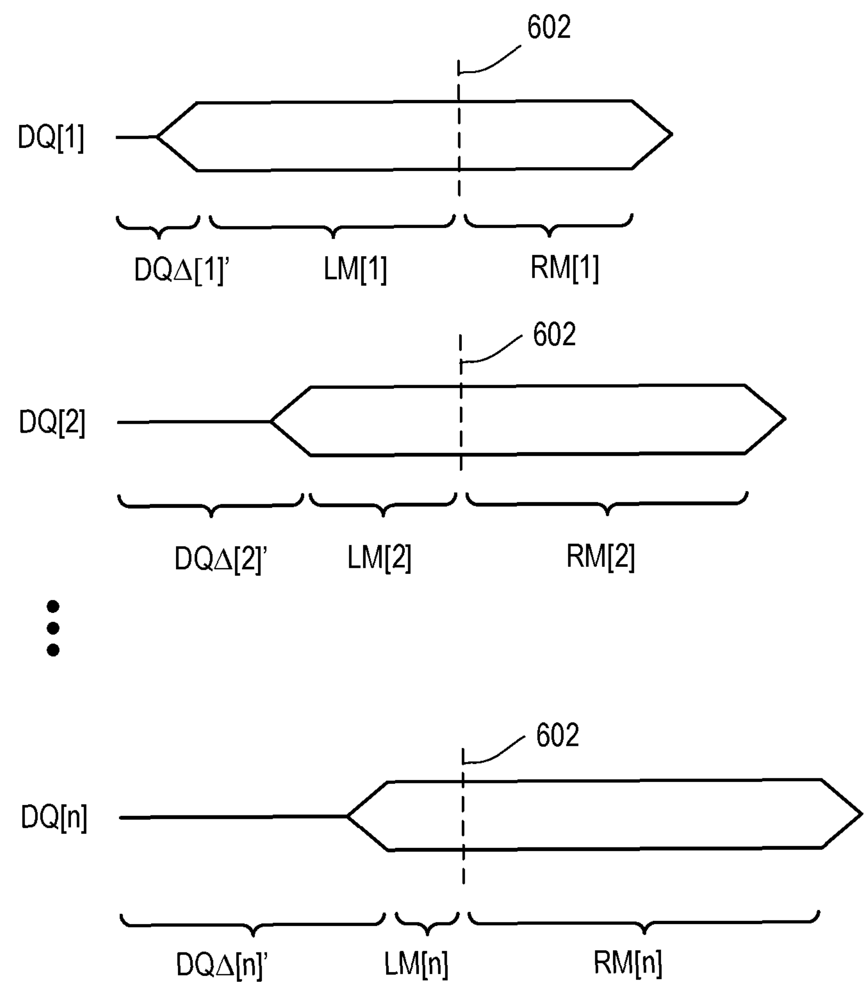
FIG. 6 illustrates the relationship between data eyes and data delay values.

FIG. 6 illustrates the relationship between the data eyes of the data signals and the data delay values calculated in step 318. In FIG. 6, the dashed lines 602 indicate the new common strobe location within the data eyes after step 320 (i.e., after the DQ delays and the DQS delay have been updated based on the values calculated at step 318). The LM[1] . . . LM[n] and RM[1] . . . RM[n] values are now the same or similar to those calculated after initial calibration at step 308. Also, the skew between data bits is also the same or similar as after initial calibration. The DQ delays DQΔ[1]' . . . DQΔ[n]' can be different than initially calculated at step 304 depending on the values calculated at step 318.

Various algorithms can be used to determine how to modify the DQ delays at step 318. In an example, if each DQS[x] is the same, then the algorithm moves the DQS delay (402 in FIG. 4) to a new DQS[x]. If there are differences across the DQs, then a combination of DQS and DQ delay adjustment is required. There are various algorithms to determine the combination of DQS and DQ delay changes in order to return to the original left and right margins determined in step 306. In general, a DQ delay adjustment that would result in final negative DQ delay (which is not possible) is avoided. In an example, the algorithm determines the DQ delay with the smallest value. The new DQS value (602 in FIG. 6) is set to the DQS corresponding to the DQ delay with the smallest value. The other DQ[x] delays are adjusted based on the difference between the new DQS delay (602) and their ideal DQS[x] requirement. This is: Added DQ[x]=New DQS−DQS[x]. A more robust algorithm can react if the Added DQ[x] results in a net negative DQ[x] delay by increasing the common DQS delay and repeating the equation above until all DQ[x] delays are non-negative.

Figure 7:
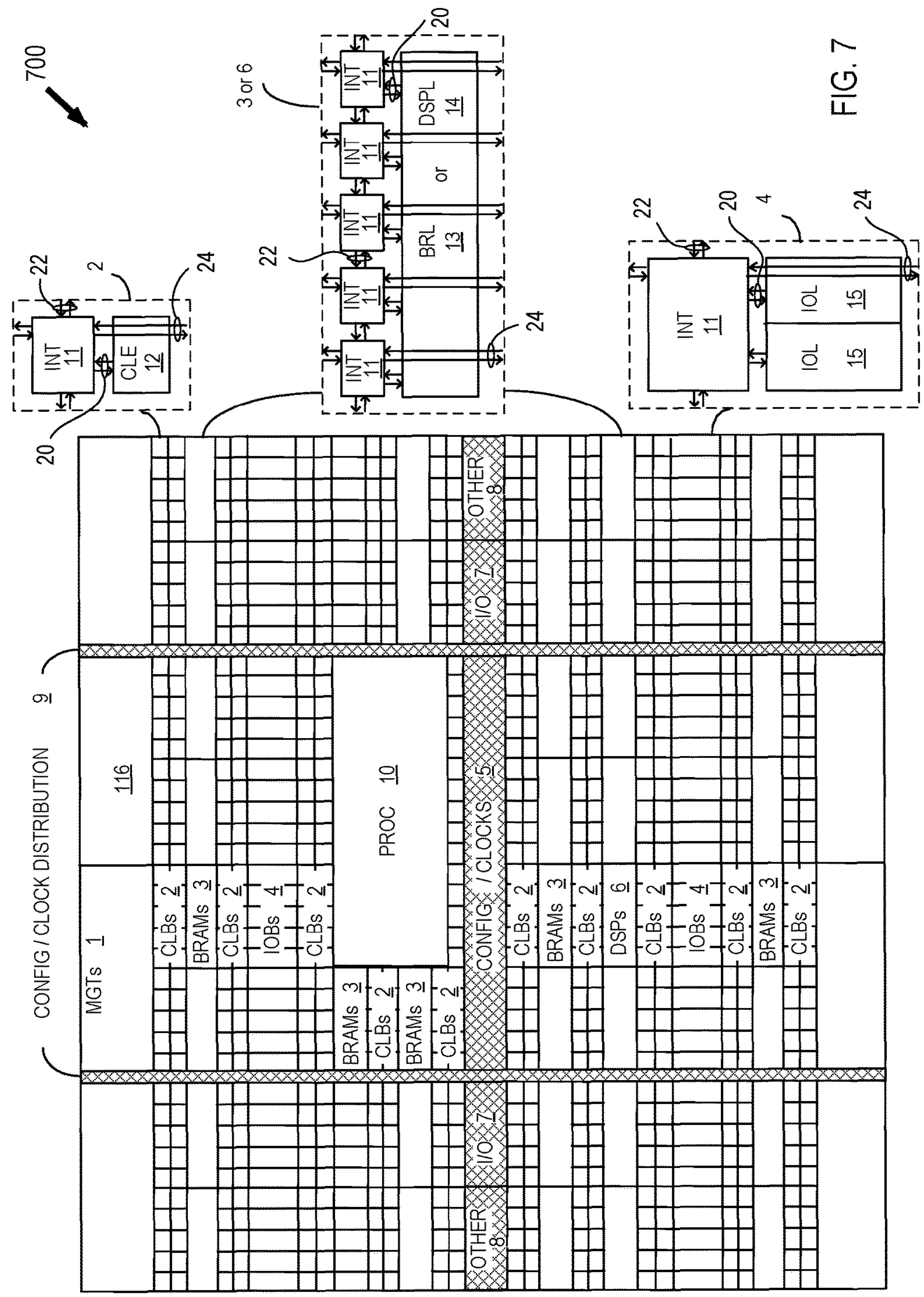
FIG. 7 illustrates a field programmable gate array (FPGA) in which the techniques described herein can be used.

The circuit 116 described above can be implemented within an integrated circuit, such as a field programmable gate array (FPGA) or like type programmable circuit. FIG. 7 illustrates an architecture of FPGA 700 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10.

In some FPGAs, each programmable tile can include at least one programmable interconnect element ("INT") 11 having connections to input and output terminals 20 of a programmable logic element within the same tile, as shown by examples included at the top of FIG. 7. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An 10B 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 11) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A method of calibrating a source-synchronous system, comprising:

performing initial calibration of a source-synchronous receiver, which is configured to receive data signals and a strobe, to determine an initial strobe delay and initial data delays;

setting a strobe delay circuit that delays the strobe to have the initial strobe delay and data delay circuits that delay the data signals to have the initial data delays;

measuring first data eye margins of the data signals at a first time;

calculating metrics for the data signals based on the first data eye margins;

measuring second data eye margins of the data signals at a second time; and updating the data delay circuits and the strobe delay circuit based on the second data eye margins and the metrics.

2. The method of claim 1, wherein the step of measuring the first data eye margins comprises:

providing a data pattern in the data signals; and determining left data eye margins and right data eye margins for the data signals.

3. The method of claim 2, wherein each of the metrics relates a respective one of the left data eye margins and a respective one of the right data eye margins.

4. The method of claim 3, wherein each of the metrics is the respective left data eye margin divided by the sum of the respective left data eye margin and the respective right data eye margin.

5. The method of claim 2, wherein the step of determining the left data eye margin for each of the data signals comprises incrementing the data delay circuits, decrementing the strobe delay circuit, or both incrementing the data delay circuits and decrementing the strobe delay circuit.

6. The method of claim 2, wherein the step of determining the right data eye margin for each of the data signals comprises incrementing the strobe delay circuit, decrementing the data delay circuits, or both incrementing the strobe delay circuit and decrementing the data delay circuits.

7. The method of claim 1, wherein the step of measuring the second data eye margins comprises:

providing a data pattern in the data signals;

determining a left data eye margin and a right data eye margin for each of the data signals; and determining a respective one of the metrics for each of the data signals by relating the left data eye margin and the right data eye margin thereof.

8. A source-synchronous receiver, comprising:

a first receiver configured to receive a strobe, the first receiver including a strobe delay circuit;

second receivers configured to receive data signals referenced to the strobe, the second receivers including data delay circuits; and a calibration circuit configured to:

perform initial calibration to determine an initial strobe delay for the strobe delay circuit and initial data delays for the data delay circuits;

measure first data eye margins of the data signals at a first time;

calculate metrics for the data signals based on the first data eye margins;

measure second data eye margins of the data signals at a second time; and update the data delay circuits and the strobe delay circuit based on the second data eye margins and the metrics.

9. The source-synchronous receiver of claim 8, wherein the calibration circuit is configured to measure the first data eye margins by determining left data eye margins and right data eye margins for the data signals.

10. The source-synchronous receiver of claim 9, wherein each of the metrics relates a respective one of the left data eye margins and a respective one of the right data eye margins.

11. The source-synchronous receiver of claim 10, wherein each of the metrics is the respective left data eye margin divided by the sum of the respective left data eye margin and the respective right data eye margin.

12. The source-synchronous receiver of claim 9, wherein the calibration circuit is configured to determine the left data eye margin for each of the data signals by incrementing the data delay circuits, decrementing the strobe delay circuit, or both incrementing the data delay circuits and decrementing the strobe delay circuit.

13. The source-synchronous receiver of claim 9, wherein the calibration circuit is configured to determine the right data eye margin for each of the data signals by incrementing the strobe delay circuit, decrementing the data delay circuits, or both incrementing the strobe delay circuit and decrementing the data delay circuits.

14. The source-synchronous receiver of claim 8, wherein the calibration circuit is configured to measure the second data eye margins by determining a left data eye margin and a right data eye margin for each of the data signals, and determining a respective one of the metrics for each of the data signals by relating the left data eye margin and the right data eye margin thereof.

15. A system, comprising:

a source-synchronous transmitter coupled to a source-synchronous receiver through a plurality of transmission lines, the source-synchronous receiver comprising a first receiver configured to receive a strobe, the first receiver including a strobe delay circuit, second receivers configured to receive data signals referenced to the strobe, the second receivers including data delay circuits, and a calibration circuit configured to:

perform initial calibration to determine an initial strobe delay for the strobe delay circuit and initial data delays for the data delay circuits;

measure first data eye margins of the data signals at a first time;

calculate metrics for the data signals based on the first data eye margins;

measure second data eye margins of the data signals at a second time; and update the data delay circuits and the strobe delay circuit based on the second data eye margins and the metrics.

16. The system of claim 15, wherein the calibration circuit is configured to measure the first data eye margins by determining left data eye margins and right data eye margins for the data signals.

17. The system of claim 16, wherein each of the metrics relates a respective one of the left data eye margins and a respective one of the right data eye margins.

18. The system of claim 17, wherein each of the metrics is the respective left data eye margin divided by the sum of the respective left data eye margin and the respective right data eye margin.

19. The system of claim 16, wherein the calibration circuit is configured to determine the left data eye margin for each of the data signals by incrementing the data delay circuits, decrementing the strobe delay circuit, or both incrementing the data delay circuits and decrementing the strobe delay circuit.

20. The system of claim 16, wherein the calibration circuit is configured to determine the right data eye margin for each of the data signals by incrementing the strobe delay circuit, decrementing the data delay circuits, or both incrementing the strobe delay circuit and decrementing the data delay circuits.

* * * * *